(12) United States Patent
Sahota et al.

(10) Patent No.: US 6,720,264 B2
(45) Date of Patent: Apr. 13, 2004

(54) PREVENTION OF PRECIPITATION DEFECTS ON COPPER INTERCONNECTS DURING CMP BY USE OF SOLUTIONS CONTAINING ORGANIC COMPOUNDS WITH SILICA ADSORPTION AND COPPER CORROSION INHIBITING PROPERTIES

(75) Inventors: Kashmir S. Sahota, Fremont, CA (US); Diana M. Schonauer, San Jose, CA (US); Johannes F. Groschopf, Wainsdorf (DE); Gerd F. C. Marxsen, Radebeul (DE); Steven C. Avanzino, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/749,191

(22) Filed: Dec. 26, 2000

(65) Prior Publication Data

US 2004/0014319 A1 Jan. 22, 2004

Related U.S. Application Data

(63) Continuation-in-part of application No. 09/434,146, filed on Nov. 4, 1999, now Pat. No. 6,503,418.

(51) Int. Cl.$^7$ .................... H01L 21/302; C09K 13/00; C09K 13/06
(52) U.S. Cl. ................ 438/692; 252/79.1; 252/79.4; 156/345
(58) Field of Search .................... 438/692; 252/79.1, 252/79.4; 156/345

(56) References Cited

U.S. PATENT DOCUMENTS

| | | | | |
|---|---|---|---|---|
| 5,240,552 A | * | 8/1993 | Yu et al. ................ | 156/636 |
| 5,478,435 A | * | 12/1995 | Murphy et al. .......... | 156/636.1 |
| 5,534,106 A | * | 7/1996 | Cote et al. ............... | 156/636.1 |
| 5,645,736 A | * | 7/1997 | Allman ................... | 216/89 |
| 5,807,165 A | * | 9/1998 | Uzoh et al. .............. | 451/41 |
| 5,861,055 A | * | 1/1999 | Allman et al. ........... | 106/3 |
| 5,985,748 A | * | 11/1999 | Watts et al. .............. | 438/622 |
| 6,143,656 A | | 11/2000 | Woo et al. ............... | 438/687 |

FOREIGN PATENT DOCUMENTS

| EP | 0846 742 A2 | 6/1998 | ............ C09G/1/02 |
|---|---|---|---|
| EP | 0913 442 A2 | 5/1999 | ............ C09G/1/02 |
| WO | WO 99/64527 | 12/1999 | ............ C09G/1/02 |

\* cited by examiner

*Primary Examiner*—Nadine G. Norton
*Assistant Examiner*—Lynette T. Umez-Eronini
(74) *Attorney, Agent, or Firm*—Farjami & Farjami LLP

(57) ABSTRACT

A Ta barrier slurry for Chemical-Mechanical Polishing (CMP) during copper metallization contains an organic additive which suppresses formation of precipitates and copper staining. The organic additive is chosen from a class of compounds which form multiple strong adsorbant bonds to the surface of silica or copper, which provide a high degree of surface coverage onto the reactive species, thereby occupying potential reaction sites, and which are sized to sterically hinder the collisions between two reactant molecules which result in new bond formation. The organic additive-containing slurry cain be utilized throughout the entire polish time. Alternatively, a slurry not containing the organic additive can be utilized for a first portion of the polish, and a slurry containing the organic additive or a polishing solution containing the organic additive can be utilized for a second portion of the polish.

15 Claims, 12 Drawing Sheets

PREVENTION OF PRECIPITATION DEFECTS ON COPPER INTERCONNECTS DURING CMP BY USE OF SOLUTIONS CONTAINING ORGANIC COMPOUNDS WITH SILICA ADSORPTION AND COPPER CORROSION INHIBITING PROPERTIES

CROSS-REFERENCE TO A RELATED APPLICATION

This application is a continuation-in-part of application Ser. No. 09/434,146, filed Nov. 4, 1999 now U.S. Pat. No. 6,503,418. The disclosure of this prior application is hereby incorporated herein by reference.

FIELD OF THE INVENTION

This invention relates to the manufacture of integrated circuits, and in particular to Chemical-Mechanical-Polishing of metal structures used in copper metallization.

BACKGROUND OF THE INVENTION

As integrated circuit devices shrink with semiconductor device geometries approaching 0.18 micron minimum feature size, and as circuit speed and performance increase, copper has replaced aluminum as the preferred electrical interconnect material. The use of copper as an interconnect material in silicon integrated circuits has occurred in response to the need for lowered interconnect resistivity, good electromigration resistance, and good deposition characteristics which allow effective filling of vias and contacts.

Copper metallization structures are often formed by a process known as Damascene, which is illustrated in FIG. 1. An insulating layer known as the Interlevel Dielectric (ILD) separates metal layers in a multilevel metallization structure. ILD dielectric layer 2, which may be comprised of a bottom layer 4 and a top, low dielectric constant layer 6, has regions 8 etched therein into which the metal lines will be inlaid. A barrier layer 10 is deposited, which serves to prevent diffusion of copper from the metal lines into the dielectric. This barrier layer is generally comprised of Ta or Ta compounds. A copper seed layer is then generally deposited, followed by an electroplated copper layer 14. The excess copper is then removed by a process known as Chemical Mechanical Polishing (CMP). CMP enhances the removal of surface material over large distances and short distances by simultaneously abrading the surface while a chemical etchant selectively attacks the surface. For this purpose, CMP utilizes a polishing slurry containing both an abrasive and a chemically active component.

Typically, in copper Damascene processing, the CMP is performed in two steps. The first CMP sters removes the excess copper from the wafer surface, and may also remove part or all of the underlying barrier layer 10. A second CMP step is then generally performed, with the objectives of 1) completely removing the conductive Ta layer from the dielectric surface between Cu lines, and 2) planarizing the surface to compensate for Cu dishing and erosion, illustrated in FIG. 2. To accomplish the second objective, the second CMP step must have a selectively higher polish rate of $SiO_2$ than of Cu, thereby compensating for Cu dishing during over-polish.

Of equal importance to these structural objectives is the quality of the polished surfaces, both Cu and $SiO_2$, with respect to both surface damage/roughness and foreign materials on the surface. Post CMP cleaning can only address removable solid materials and ionic contamination.

The preferred abrasive used in slurries for Ta barrier polishing is silica, although other abrasives such as alumina have been used. The advantages to using silica abrasive in place of the alumina abrasive commonly used in other CMP applications include: 1) increased Ta removal rate, 2) greater ability to polish the oxide dielectric film for planarization, and 3) the potential for minimizing damage to the oxide and Cu surfaces. All of these advantages result from the high chemical reactivity of silica, resulting in a higher ratio of chemical to mechanical component of the polish than would occur using alumina abrasive. The hydrolysis of Si—O—Si bonds to Si—OH HO—Si, and the reverse chemical process, namely, condensation of Si—OH HO—Si to Si—O—Si+ $H_2O$, form the basis of much of the well documented chemistry of silica, as described by R. K. Iler in *The Chemistry of Silica,* Wiley-Interscience, New York, 1979. However, this high chemical reactivity poses difficult challenges in preventing unwanted reactions involving silica from occurring on the wafer surface.

A typical silica abrasive slurry used for Ta barrier polishing comprises 50–300 nm diameter silica particles suspended in an aqueous medium. To avoid the problem of copper corrosion during and after polish, copper corrosion inhibiting compounds such as benzotriazole or 1,2,4-triazole (hereinafter referred to as "triazole"), are typically dissolved in the slurry medium, and the pH of the suspension is adjusted to a value between pH7 and pH10.5, which is the range empirically found to produce the lowest corrosion rates. Byproducts of the polishing process result in the slurry medium containing dissolved silica, dissolved copper, and dissolved tantalum, in addition to the formulating slurry ingredients.

In the prior art, two types of solid defects have been seen after CMP of copper features using silica slurries, and also after CMP of copper features using alumina slurries when $SiO_2$ was present. These defects include precipitates and copper stains. The use of copper corrosion inhibiting compounds (also known as "Cu passivation agents") such as triazole compounds in the slurry has been found to greatly amplify the occurrence of these defects. The precipitated residues, which are comprised in part of conducting material s, adversely affect device yield and reliability, for example by causing shorting and/or line-to-line leakage. Residues and precipitates additionally prevent the dielectric barrier from effectively sealing the top surface of the copper line, resulting in copper diffusion into the dielectric as well as providing a surface electromigration path for copper atoms.

SUMMARY OF THE INVENTION

It is therefore an object of this invention to provide an improved CMP slurry for the polishing of Ta barrier layers in copper metallization during integrated circuit processing which yields a lowered incidence of silica precipitates and copper stains.

It is a further object of this invention to provide a CMP slurry for the polishing of Ta barrier layers in copper metallization during integrated circuit processing which includes copper corrosion-inhibiting compounds such as triazole compounds, which further includes silica abrasive, and which yields a lowered incidence of silica precipitates and copper stains.

It is a further object of this invention to provide a CMP slurry for the polishing of Ta barrier layers in copper metallization during integrated circuit processing which inhibits chemical reactions between silica, triazole, and copper.

Our invention meets these objects by providing a CMP slurry for the polishing of Ta barrier layers underlying copper metallization which includes at least one additional slurry component which inhibits silica-triazole-copper reactions. A set of chemical compounds has been successfully used in a CMP slurry to inhibit said reactions, including organic compounds which form hydrogen bonds to the surface of polymeric silica molecules with a high degree of surface coverage, and which also adsorb onto copper hydroxo species. Alternative embodiments are disclosed which employ the additive-containing slurry or a portion thereof at various times in the polishing process.

BRIEF DESCRIPTION OF THE DRAWINGS

FIG. 4i is a drawing believed to show the bonding configuration between a PEI molecule and the silica surface.

DETAILED DESCRIPTION OF THE INVENTION

The chemical literature describes the tendency of silica to form strong chemical bonds to the polybasic metal ions of such elements as copper and tantalum. Solutions of copper salts are known to coagulate or co-precipitate with silica at pH values greater than 5. Furthermore, the chemically-oxidized copper surfaces that remain after CMP provide ready nucleation sites for precipitation reactions to occur.

Figure 1:
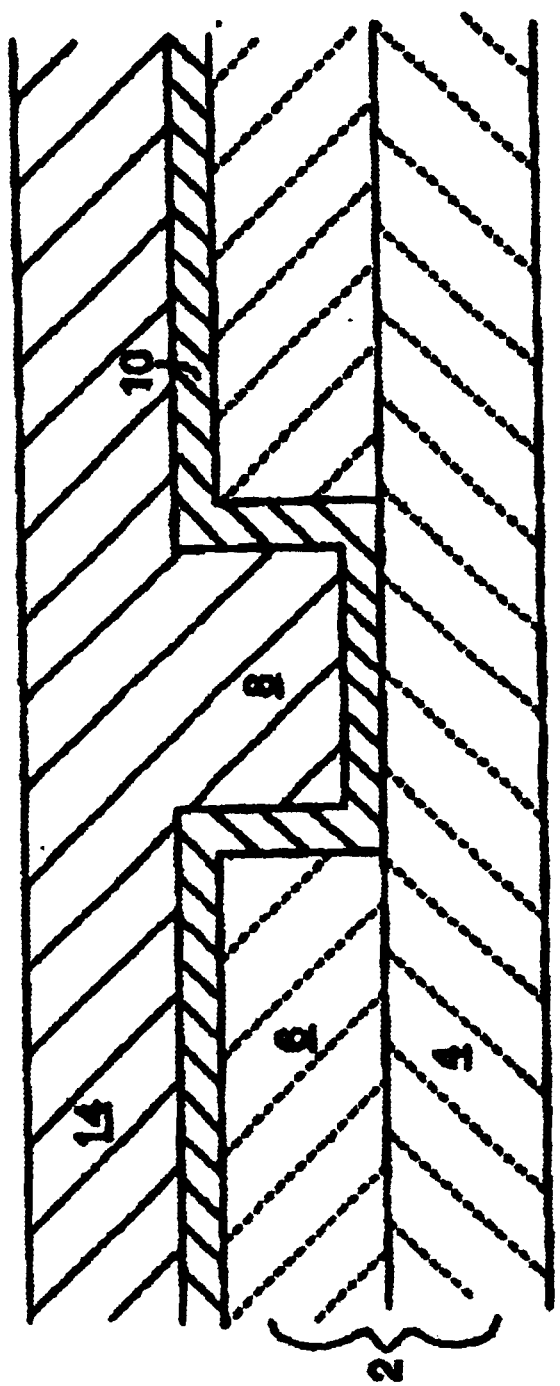
FIG. 1 illustrates a typical Damascene structure used in copper metallization systems.
Figure 2:
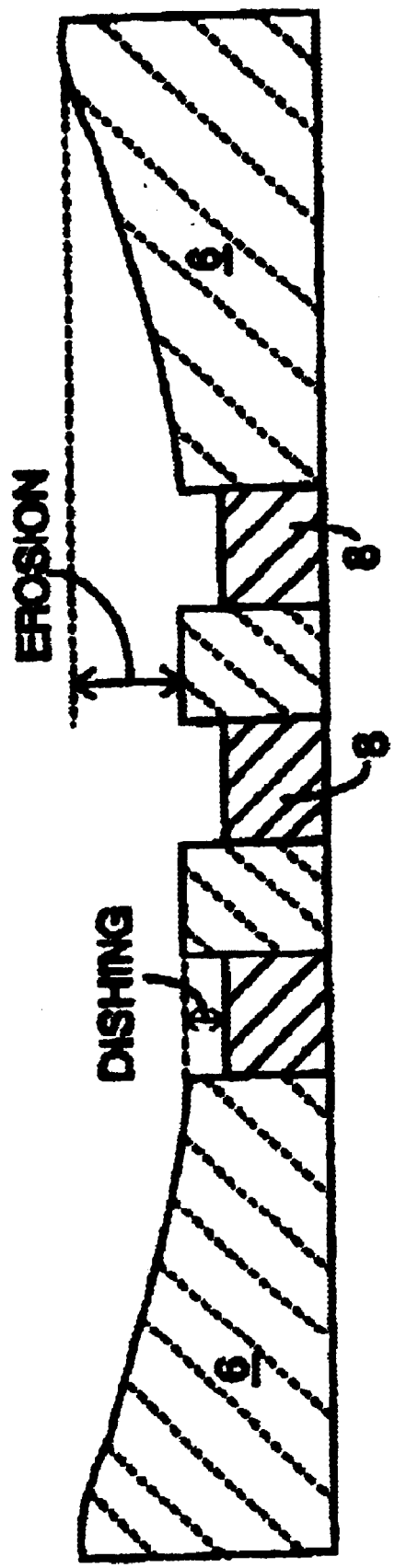
FIG. 2 illustrates the dishing effect seen after copper CMP.
Figure 3:
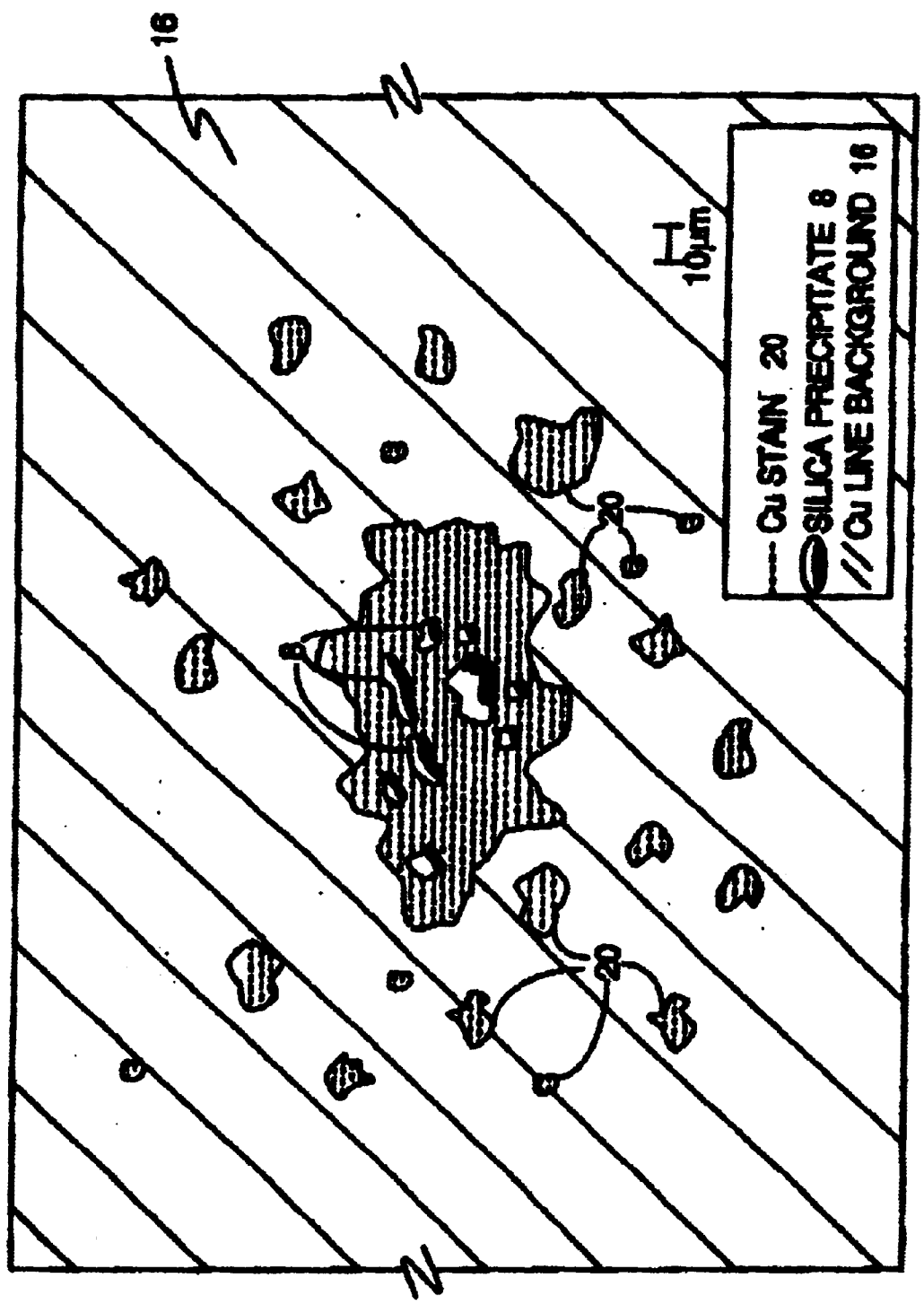
FIG. 3 is a drawing of an SEM photograph showing silica precipitates and copper staining followings CMP of Ta barrier layer during Damascene processing.

The precipitated residues detected after CMP using a triazole-containing slurry comprise silica/copper hydroxide/triazole, hereinafter referred to as "silica precipitates", and copper/triazole, hereinafter referred to as "copper stains". FIG. 3 is a drawing of an SEM picture of copper lines 16 after Ta CMP, showing silica precipitates 18 and copper stains 20. These residues are chemically grown on the surfaces, and they are not readily removed during post-CMP cleaning. It is believed that similar residues will occur when using other Cu corrosion inhibiting compounds such as benzotriazole.

Our invention provides for a re-engineering of the Ta slurry chemistry and/or polish process during all or a portion of the polish step, by inclusion of an additional slurry or polishing component, in order to suppress the chemical reactions between triazole, silica, and copper, which cause the formation of silica precipitates, and copper stains. Inhibiting the chemical reaction between silica and copper, or between either or both of the two and triazole, has been achieved bat adding one of a set of chemical species, each of said species exhibiting several characteristics. A first characteristic is that the chemical species strongly adsorbs onto the surface of silica and/or copper hydroxide. A second characteristic of the adsorbing chemical species is the ability to provide a high degree of surface coverage onto the reactive species, thereby occupying potential reaction sites. A third characteristic which affects the degree of inhibition of the silica/copper reaction is the size of the adsorbing molecules. An optimally sized adsorbant will sterically hinder the collisions between two reactant molecules which result in new bond formation.

The additives described hereinafter will be analyzed primarily according to their interaction with the silica surface, which is comprised of silicon atoms bonded either to neutral oxygen atoms, negatively charged O-species, or to OH (hydroxyl) groups. The silica may be silica slurry particles, or it may be dissolved silica byproducts from CMP. Since it has been determined that copper stains contain copper but do not contain silica, in order to inhibit copper staining the additives must also form similar bonds to the copper surface or to copper ions in solution. The oxidized copper surface contains a combination of species including copper atoms bonding to neutral oxygen atoms or OH groups. Additionally, aqueous copper ions in solution can have hydroxyl groups replacing one or more of the water molecules bonding to the copper ions. Due to the similar configurations and bonding of surface oxygen and OH on the copper and silica surfaces, additives which adsorb onto the silica surface according to the aforementioned characteristics should exhibit like bonding behavior on the copper surface and/or the copper ions in solution. The results included hereinafter for the various slurry additives were obtained using the inventive slurry throughout the polish process.

Following the description of the various slurry additives, several alternative methods of applying the additive or additive-containing slurry to the polish sequence will be di,scribed.

A. DESCRIPTION OF SLURRY ADDITIVES

Hydrogen Bonding Additives

A category of chemical species which exhibits some or all of the above three characteristics comprises organic chemical substances which form multiple hydrogen bonds to the surfaces of polymeric silica molecules and of copper (hydroxo) species.

If a hydrogen atom is bonded to a very electronegative atom such as oxygen, nitrogen, or fluorine, it is capable of forming another weak bond with another electronegative atom which has a pair of nonbonded electrons. This interaction, called the hydrogen bond, is a chemical bond which is weaker than covalent or ionic bonds because the dissociation energy of a hydrogen bond is only about 7 kcal/mole. However, the hydrogen bond is much stronger than the ordinary van der Waals bonds between molecules.

We have shown that several chemical species from the aforementioned category of organic chemical substances which form multiple hydrogen bonds to the surfaces of polymeric silica molecules and/or of copper(hydroxo) species can be successfully used in slurries for Ta barrier layer CMP to suppress the formation of silica precipitates and copper stains. These chemical species comprise:

1. poly(vinyl alcohol), 98% hydrolyzed
2. polyacrylamide
3. poly(ethylene glycol)
4. dimethylsiloxane-ethylene oxide co-polymer
5. glycerol propoxylate The chemistry and testing of each of these species will be addressed separately.

1. Poly(vinyl alcohol), 98% Hydrolyzed

Figure 4A:
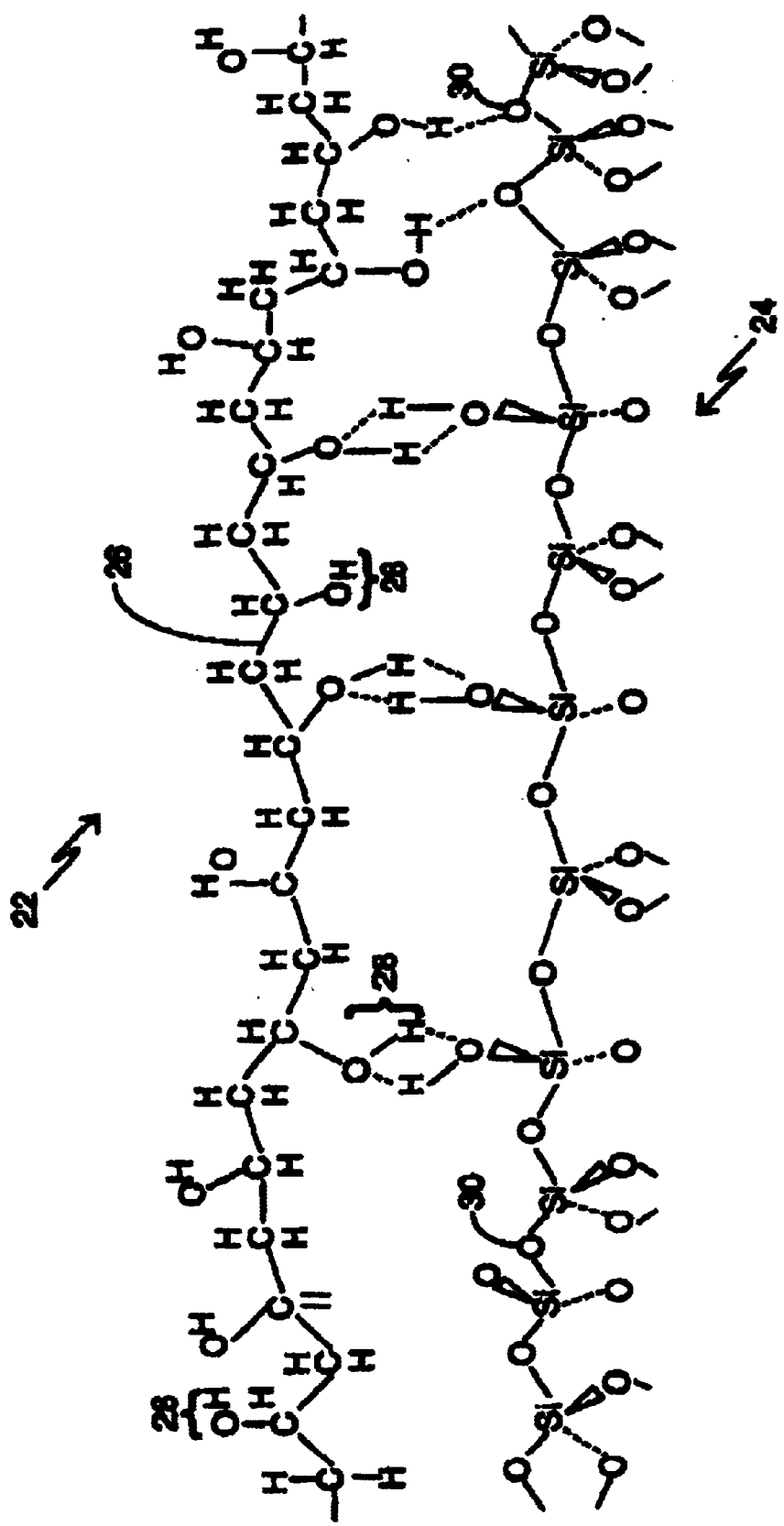
FIG. 4a is a drawing believed to show the bonding configuration between a PVA molecule and the silica surface.

This compound has been tested in a form having molecular weight of 13,000–23,000, with an average molecular weight of 18,000. The abbreviation for this compound is designated as PVA-18000. Its chemical structure is [—$CH_2CH(OH)$—]$_{400}$. FIG. 4a illustrates what is believed to be the bonding configuration between the PVA molecule 22 and the silica surface 24. The $CH_2$—CH bonds which form the backbone 26 of the alcohol molecule are tetrahedral rather than linear, yielding a long string-like structure which wraps repeatedly, forming into a quasi-spherical structure. The large number of protruding hydroxyl (OH) groups 28 form multiple hydrogen bonds with the surface oxygen atoms 30 on the silica particles. A large multiply-bonded complex is thereby formed which will not be likely to detach.

Four different Ta barrier slurry formulations containing PVA-18000 have been tested. Each one includes a silica abrasive manufactured by the Cabot Corporation, called Cabot SC113. Cabot SC113 is an aqueous suspension of silica containing 13+/−0.5 wt % silica, $H_2O$, and containing a trace of KOH to adjust the pH to 10.3. The silica particle size distribution has a mean value of 204 nm wvith a standard deviation of 63 nm on a volume-averaged basis. Two of the slurry formulations also include a small amount of sodium dodecylbenzenesulfonate (NaDBS), an anionic surfactant which has been claimed in the literature to enhance the adsorption of PVA onto silica. In all of the slurry formations described hereinafter, the weight percentages of compounds other than Cabot SC113 silica suspension are noted, and the remainder of the slurry is comprised of the Cabot SC113.

The control slurry as di,scribed below is the same for all tested additives.

The tested slurry formulations are as follows:

| | |
|---|---|
| Slurry F: | Cabot SC113 |
| | 1,2,4-triazole (1.54 wt %) |
| | PVA-18000 (0.11 wt %) |
| | $H_2O$ (4.35 wt %) |
| Slurry G: | Cabot SC113 |
| | 1,2,4-triazole (1.54 wt %) |
| | PVA-18000 (0.55 wt %) |
| | $H_2O$ (4.33 wt %) |
| Slurry 1a: | Cabot SC113 |
| | 1,2,4-triazole (1.54 wt %) |
| | PVA-18000 (0.22 wt %) |
| | sodium dodecylbenzenesulfonate (0.05 wt %) |
| | $H_2O$ (4.34 wt %) |
| Slurry 1b: | Cabot SC113 |
| | 1,2,4-triazole (1.54 wt %) |
| | PVA-18000 (0.55 wt %) |

-continued

| | |
|---|---|
| | sodium dodecylbenzenesulfonate (0.13 wt %) |
| | $H_2O$ (4.33 wt %) |
| Control slurry: | Cabot SC113 |
| | 1,2,4-triazole (1.54 wt %) |
| | $H_2O$ (4.36 wt %) |

The pH of each of these slurries, including the control slurry, is 8.9+/−0.1. All of the above composition, result in colloidal suspensions which are stable with respect to silica particle size distribution over a time period greater than two months.

Using a standardized Cu Damascene process, all of the above slurries have been evaluated for 1) their polishing rates of unpatterned Cu, Ta, and $SiO_2$ films, 2) the degree of Cu line dishing and Cu pattern erosion that results when used as a second step Ta polish, and 3) the tendency of the slurry to produce precipitate residues on Cu features. The results for these and all the other slurries tested are summarized in Table 1 at the end of the specification. No silica precipitate or copper stain residues are discemable using visual (optical microscope) and SEM inspection at any wafer locations for slurries F, G, 1a, or 1b. In comparison, the control Ta barrier slurry results in heavy silica precipitate and stain residues located across the entire wafer. The same control Ta barrier slurry is used in all experiments described hereinafter.

PVA exists with average molecular weight ranging between approximately 9000 and 186,000, and also exists in co-polymer form with both poly (vinyl acetate) and polyethylene. It is believed that these other forms of PVA will also act as precipitate inhibitors. It is believed that PVA or other polymeric alcohols with molecular weight equal to or greater than 18,000 are the most effective, but that a molecular weight of greater than 10,000 is acceptable. Concentrations of 0.1 wt % or greater are believed to be effective, possibly as low as 0.01 wt %.

Lower molecular weight alcohols and sugars are also appropriate candidates for suppressing silica precipitation and copper stains. A Ta slurry formulation using a lower molecular weight sugar, sorbital, has been tested. Sorbitol has the chemical structure

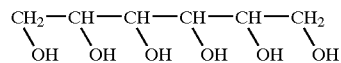

which allows hydrogen bonding to silica through the hydroxyl groups.

The tested slurry formulation is as follows:

| | |
|---|---|
| Slurry 4b: | Cabot SC113 |
| | 1,2,4-triazole (1.54 wt %) |
| | sorbitol (1.00 wt %) |
| | $H_2O$ (4.3 1 wt %) |

The results from this slurry are summarized in Table 1. The addition of sorbitol was effective in reducing the degree of silica precipitation and copper stain found on the wafer relative to the control Ta slurry. However, some precipitation residues do remain, so that the use of sorbitol is judged to be not as effective as PVA-18000 in precipitate prevention. Many other low molecular weight, hydroxyl-containing compounds, glycerol by way of example, are believed to exhibit some degree of precipitate suppression.

2. Polyacrylamide

Figure 4B:
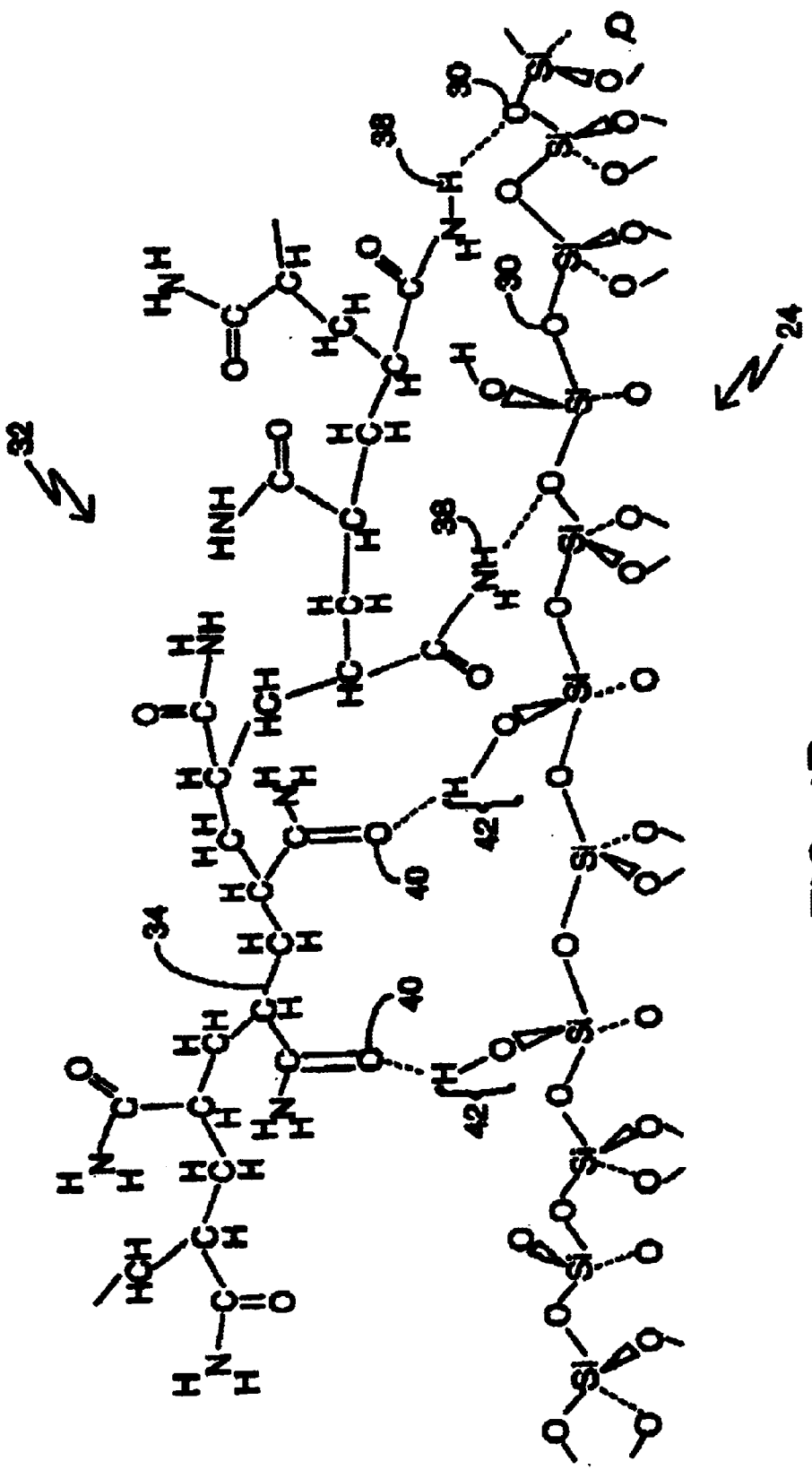
FIG. 4b is a drawing believed to show the bonding configuration between a PAA molecule and the silica surface.

This compound has been tested in a first form having an average molecular weight of 10,000, and a second form having an average molecular weight of 1500. The abbreviations for these compounds are designated as PAA-10000 and PAA-1500 respectively. Their chemical structures are $[-CH_2CH(CONH_2)-]_{\sim 141}$ and $[-CH_2CH(CONH_2)-]_{\sim 21}$ respectively. FIG. 4b illustrates what is believed to be the bonding configuration between the PAA molecule 32 and the silica surface 24. The $CH_2-CH$ bonds which form the backbone 34 of the PAA molecule are tetrahedral rather than linear, yielding a long string-like stricture which wraps repeatedly, forming into a quasi-spherical structure. The PAA molecules can hydrogen bond to silica through the amide functional groups 36 in one of two modes: 1) through its amido hydrogens 38 to bridging oxygen atoms 30 on silica surface 24, or 2) through its carbonyl oxygens 40 to silanol sites 42 on silica surface 24. Multiple hydrogen bonds are formed, and a large multiply-bonded complex is thereby formed which will not be likely to detach.

Four different Ta slum, formulations containing PAA-10000 and PAA-1500 have been tested.

The tested slurry formulations are as follows:

| | |
|---|---|
| Slurry 12a: | Cabot SC113 |
| | 1,2,4-triazole (1.54 wt %) |
| | PAA-10000 (0.10 wt %) |
| | $H_2O$ (4.45 wt %) |
| Slurry 12b: | Cabot SC113 |
| | 1,2,4-triazole (1.54 wt %) |
| | PAA-10000 (1.00 wt %) |
| | $H_2O$ (5.25 wt %) |
| Slurry D: | Cabot SC113 |
| | 1,2,4-triazole (1.54 wt %) |
| | PAA-1500 (0.10 wt %) |
| | $H_2O$ (4.45 wt %) |
| Slurry E: | Cabot SC113 |
| | 1,2,4-triazole (1.54 wt %) |
| | PAA-1500 (1.00 wt %) |
| | $H_2O$ (5.25 wt %) |

The pH of each of these slurries is 8.9+/−0.1. All of the above compositions result in colloidal suspensions which are stable with respect to silica size distribution over more than two months time. Using a standardized Cu Damascene process, all of the above slurries have been evaluated for 1) their polishing rates of unpatterned Cu, Ta, and $SiO_2$ films, 2) the degree of Cu line dishing and Cu pattern erosion that results when used as a second step Ta polish, and 3) the tendency of the slurry to produce precipitate residues on Cu features. The results are summarized in Table 1. No silica precipitate or copper stain residues are discernable using visual and SEM inspection at any wafer locations for slurry 12b. The wafers polished with slurries 12a, D, and E exhibit a moderate degree of silica precipitate and stain, although less than present on the wafers using the control slurry. This result indicates that both concentration of polymer in the slurry and the weight or size of the polymer molecule are important factors in suppressing precipitate residues when using polyacrylamide. It is believed that molecular weight greater than or equal to 1500 with concentration of 0.1 wt % or greater will be effective when using polyacrylamide as a precipitate/residue suppressant.

3. Poly(ethylene glycol)

Figure 4C:
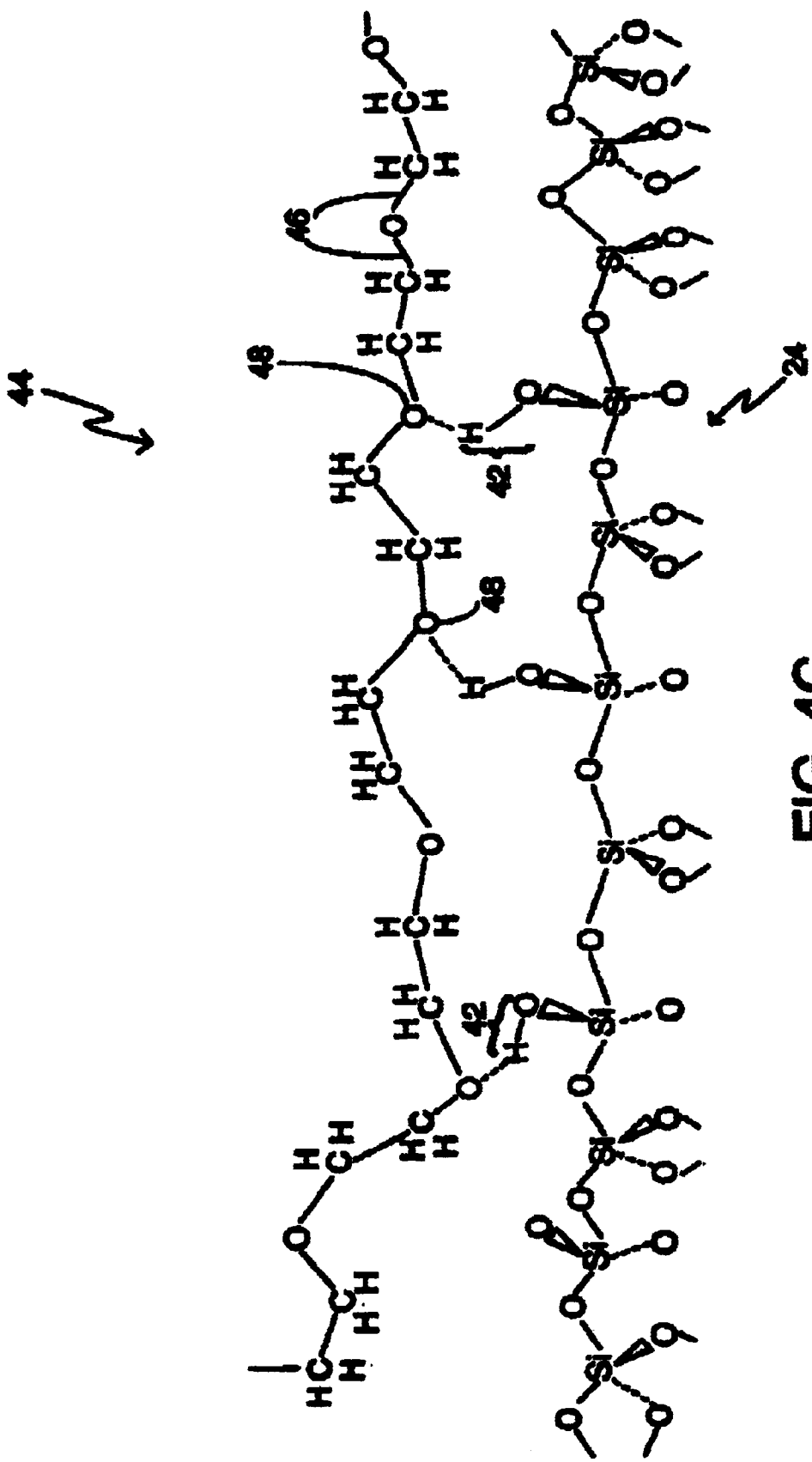
FIG. 4c is a drawing believed to show the bonding configuration between a PEG molecule and the silica surface.

This compound has been tested in a first form having an average molecular weight of 10,000, at second form having an average molecular weight of 1000, and a third form having an average molecular weight of 200. The abbreviations for these compounds are designated as PEG-10000, PEG-1000, and PEG-200 respectively. Their chemical structures are $H(OCH_2CH_2)_{\sim 227}OH$, $H(OCH_2CH_2)_{\sim 22}OH$, and $H(OCH_2CH_2)_{\sim 4}OH$ respectively. FIG. 4c illustrates what is believed to be the bonding configuration between the PEG molecule 44 and the silica surface 24. The $O-CH_2-CH_2$ bonds which form the backbone 46 of the PEG molecule are tetrahedral rather than linear, yielding a long string-like structure which wraps repeatedly, forming into a quasi-spherical structure The PEG molecules hydrogen bond to silica through ether oxygens 48 to silanol sites 42 on silica surface 24. Multiple hydrogen bonds are formed, and a large multiply-bonded complex is thereby formed which will not be likely to detach.

Six different Ta barrier slurry formulations containing PEG-10000, PEG-1000, and PEG-200 have been tested.

The tested slurry formulations are as follows:

| | |
|---|---|
| Slurry 11a: | Cabot SC113 |
| | 1,2,4-triazole (1.54 wt %) |
| | PEG-10000 (0.10 wt %) |
| | $H_2O$ (4.35 wt %) |
| Slurry 11b: | Cabot SC113 |
| | 1,2,4-triazole (1.54 wt %) |
| | PEG-10000 (1.00 wt %) |
| | $H_2O$ (4.31 wt %) |
| Slurry 2b: | Cabot SC113 |
| | 1,2,4-triazole (1.54 wt %) |
| | PEG-1000 (0.10 wt %) |
| | $H_2O$ (4.35 wt %) |
| Slurry 2d: | Cabot SC113 |
| | 1,2,4-triazole (1.54 wt %) |
| | PEG-1000 (1.00 wt %) |
| | $H_2O$ (4.31 wt %) |
| Slurry 2a: | Cabot SC113 |
| | 1,2,4-triazole (1.54 wt %) |
| | PEG-200 (0.10 wt %) |
| | $H_2O$ (4.35 wt %) |
| Slurry 2c: | Cabot SC113 |
| | 1,2,4-triazole (1.54 wt %) |
| | PEG-200 (1.00 wt %) |
| | $H_2O$ (4.31 wt %) |

The pH of each of these slurries is 8.9+/−0.1. All of the above compositions result in colloidal suspensions which are stable with respect to silica size distribution over greater than two months time.

Using a standardized Cu Damascene process, all of the above slurries have been evaluated for 1) their polishing rates of unpatterned Cu, Ta, and $SiO_2$ films, 2) the degree of Cu line dishing and Cu pattern erosion that results when used as a second step Ta polish, and 3) the tendency of the slurry to produce precipitate residues on Cu features. The results are summarized in Table 1. No silica precipitate or copper stain residues are discernable using visual or SEM inspection at any wafer locations for slurry 41b. Slurry 11a has produced equally good results except for a statistical anomaly at one site on one wafer only. The wafers polished with slurries 2a, 2b, and 2d exhibit a minor degree of silica precipitate and stain, although much less than present on the wafers using the control slurry. The wafer polished with slurry 2c exhibits a moderate degree of silica precipitate and stain, although less than present on the control. These results indicate that PEG should be effective as a residue/precipitate inhibitor for molecular weights above 200 and for concentrations above 0.1 wt %.

Four additional Ta barrier slurry formulations containing compounds closely related to poly(ethylene glycol), namely structural isomers of poly(ethylene glycol) or low molecular weight ethylene glycol ether compounds, have been tested.

Slurry 6c and slurry 6d have been formulated using glycerol ethoxylate Mn 1000, a structural isomer to PEG-1000, with a designated abbreviation of GEO-1000. The compound has the molecular structure

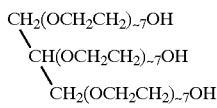

Figure 4D:
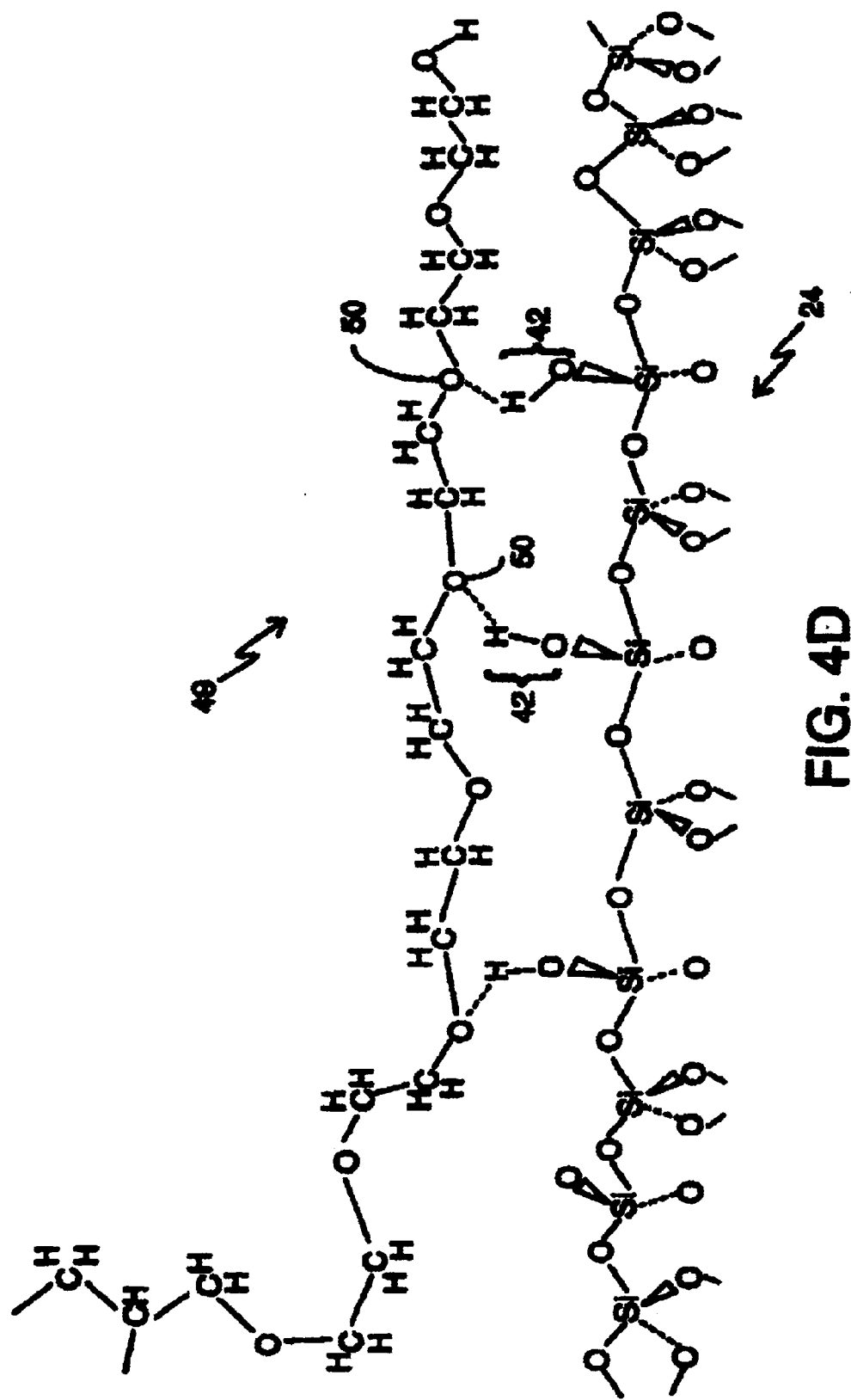
FIG. 4d is a drawing believed to show the bonding configuration between a GEO molecule and the silica surface.

FIG. 4d illustrates what is believed to be the bonding configuration between the GEO molecule 49 and the silica surface 24. The GEO molecule bonds to the silica surface similarly to the PEG molecule, with the GEO ether oxygens 50 forming hydrogen bonds to silanol sites 42 on silica surface 24.

Figure 4E:
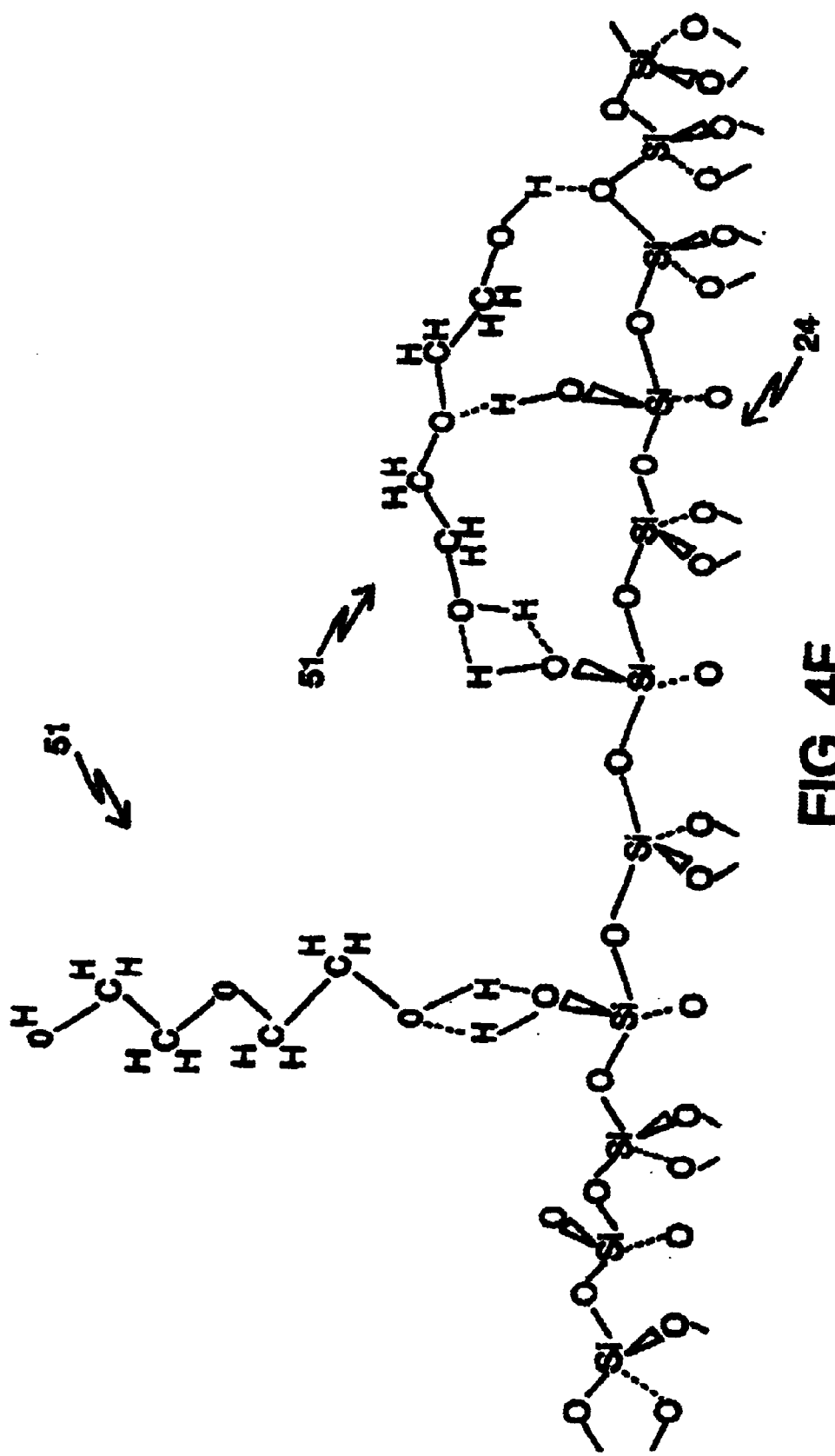
FIG. 4e is a drawing believed to show the bonding configuration between a DEG molecule and the silica surface.

Slurry 6a and slurry 6b have been formulated using di(ethylene glycol), a low molecular weight compound with a designated abbreviation of DEG, having the molecular structure $(HOCH_2CH_2)_2O$. FIG. 4e illustrates what is believed to be the bonding configuration between the DEG molecule 51 and the silica surface 24.

The tested slurry formulations are as follows:

| Slurry 6c: | Cabot SC113 |
| --- | --- |
| | 1,2,4-triazole (1.54 wt %) |
| | GEO-1000 (0.10 wt %) |
| | H$_2$O (4.35 wt %) |
| Slurry 6d: | Cabot SC113 |
| | 1,2,4-triazole (1.54 wt %) |
| | GEO-1000 (1.00 wt %) |
| | H$_2$O (4.31 wt %) |
| Slurry 6a: | Cabot SC113 |
| | 1,2,4-triazole (1.54 wt %) |
| | DEG (0.10 wt %) |
| | H$_2$O (4.35 wt %) |
| Slurry 6b: | Cabot SC113 |
| | 1,2,4-triazole (1.54 wt %) |
| | DEG (1.00 wt %) |
| | H$_2$O (4.31 wt %) |

The pH of each of these slurries is 8.9+/−0.1. All of the above compositions result in colloidal suspensions which are stable with respect to silica size distribution over greater than two months time.

Using a standardized Cu Damascene process, all of the above slurries have been evaluated for 1) their polishing rates of unpatterned Cu, Ta, and SiO$_2$ films, 2) the degree of Cu line dishing and Cu pattern erosion that results when used as a second step Ta polish, and 3) the tendency of the slurry to produce precipitate residues on Cu features. The results are summarized in Table 1.

Wafers polished with slurries 6a, 6b, and 6d exhibit a moderate degree of silica precipitate and stain, although less than present on the control. However, the wafer polished with slurry 6c shows little improvement in the degree of precipitation when compared to the control.

4. Dimethylsiloxane-Ethylene Oxide Co-Polymer

The abbreviation for this compound is designated as DMSiO-EO. Its chemical structure is

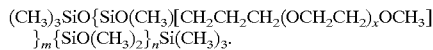

Figure 4F:
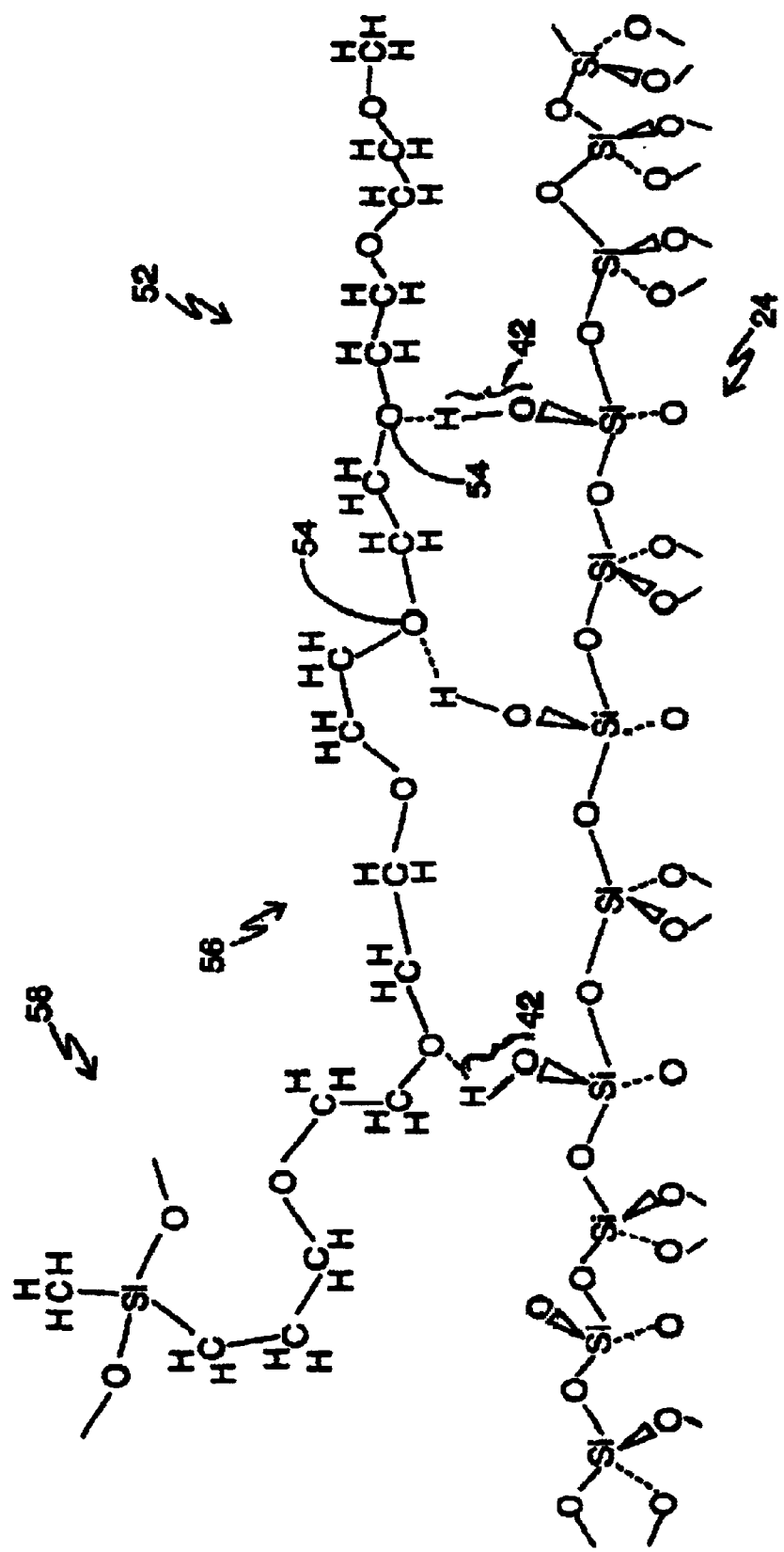
FIG. 4f is a drawing believed to show the bonding configuration between a DMSiO-EO molecule and the silica surface.

Its molecular weight is in the range between 600 and 1000. FIG. 4f illustrates what is believed to be the bonding configuration between the DMSiO-EO molecule 52 and the silica surface 24. The DMSiO-EO molecules hydrogen bond to silica through ether oxygens 54 to silanol sites 42 on silica surface 24. DMSiO-EO is a classic surfactant molecule. 75% of the molecule's mass is comprised of polyethylene oxide branches 56 which are hydrophilic, i.e., which readily react with or dissolve in water. The remaining 25% of the molecule's mass is comprised of silicone tail 58 which is hydrophobic, i.e., which is not capable of reacting with or dissolving in water. As a result of these two components of the molecule, the complete DMSiO-EO molecule will mix with water, but will readily coat onto an available surface such as the silica surface. These surfactant characteristics of DMSiO-EO lead to a much greater adsorption onto polymeric silica and solid silica surfaces than occurs for other hydrogen bonding molecules that are not surface-active. Consequently, beneficial effects are expected at reduced DMSiO-EO concentration levels.

Two different Tat slurry formulations containing DMSiO-EO have been tested.

The tested slurry formulations are as follows:

| Slurry 3a: | Cabot SC113 |
| --- | --- |
| | 1,2,4-triazole (1.54 wt %) |
| | DMSiO-EO (0.01 wt %) |
| | H$_2$O (4.36 wt %) |
| Slurry 3b: | Cabot SC113 |
| | 1,2,4-triazole (1.54 wt %) |
| | DMSiO-EO (0.10 wt %) |
| | H$_2$O (4.35 wt %) |

The pH of each of these slurries is 8.9+/−0.1. Each of the above compositions result in colloidal suspensions which are stable with respect to silica size distribution over greater than two months time.

Using a standardized Cu Damascene process, each of the above slurries has been evaluated for 1) its polishing rates of unpatterned Cu, Ta, and SiO$_2$ films, 2) the degree of Cu line dishing and Cu pattern erosion that results when used as a second step Ta polish, and 3) the tendency of the slurry to produce precipitate residues on Cu features. The results are summarized in Table 1. No silica precipitate or copper stain residues are discernable using visual and SEM inspections at any wafer locations for slurry 3b. The wafer polished with slurry 3a exhibits a very minor degree of localized silica precipitate, although much less than present on the wafers using the control slurry, and no copper staining. These results indicate that DMSiO-EO will be effective as a precipitate/residue inhibitor for concentrations of 0.01 wt % or greater.

The portion of the DMSiO-EO molecule which bonds to the silica surface is the EO (ethylene oxide) portion. Therefore, its bonding is equivalent to the aforementioned PEG or GEO molecules. It is seen that the surfactant DMSiO-EO yielded as good.or better results at 0.01 wt % than were seen for the equivalent ion-surfactant PEG and GEO molecules at 0.1 wt %. It is therefore concluded that use of surfactant additives can decrease the needed additive concentration for suppression of precipitates and residues.

DMSiO-EO is representative of a class of non-ionic surfactant compounds that can hydrogen bond with silica and/or copper and which therefore have the potential to suppress or prevent precipitate residues. Other such surfactants containing PolyEthylene Oxide (PEO) include:

octylphenol polyethylene oxide
nonylphenol polyethylene oxide
polyoxyethylene lauryl ether
polyoxyethylene cetyl ether.

There also exist perfluorinated analogs of these compounds. It is believed that these surfactants will act similarly to DMSiO-EO as precipitate/residue inhibitors.

5. Glycerol Propoxylate

This compound has be(en tested in a first form having an average molecular weight of 1500 and a second form having an average molecular weight of 260. The abbrevial ions for these compounds are designated as GPO-1500 and GPO-260 respectively. Their chemical structures are

Figure 4G:
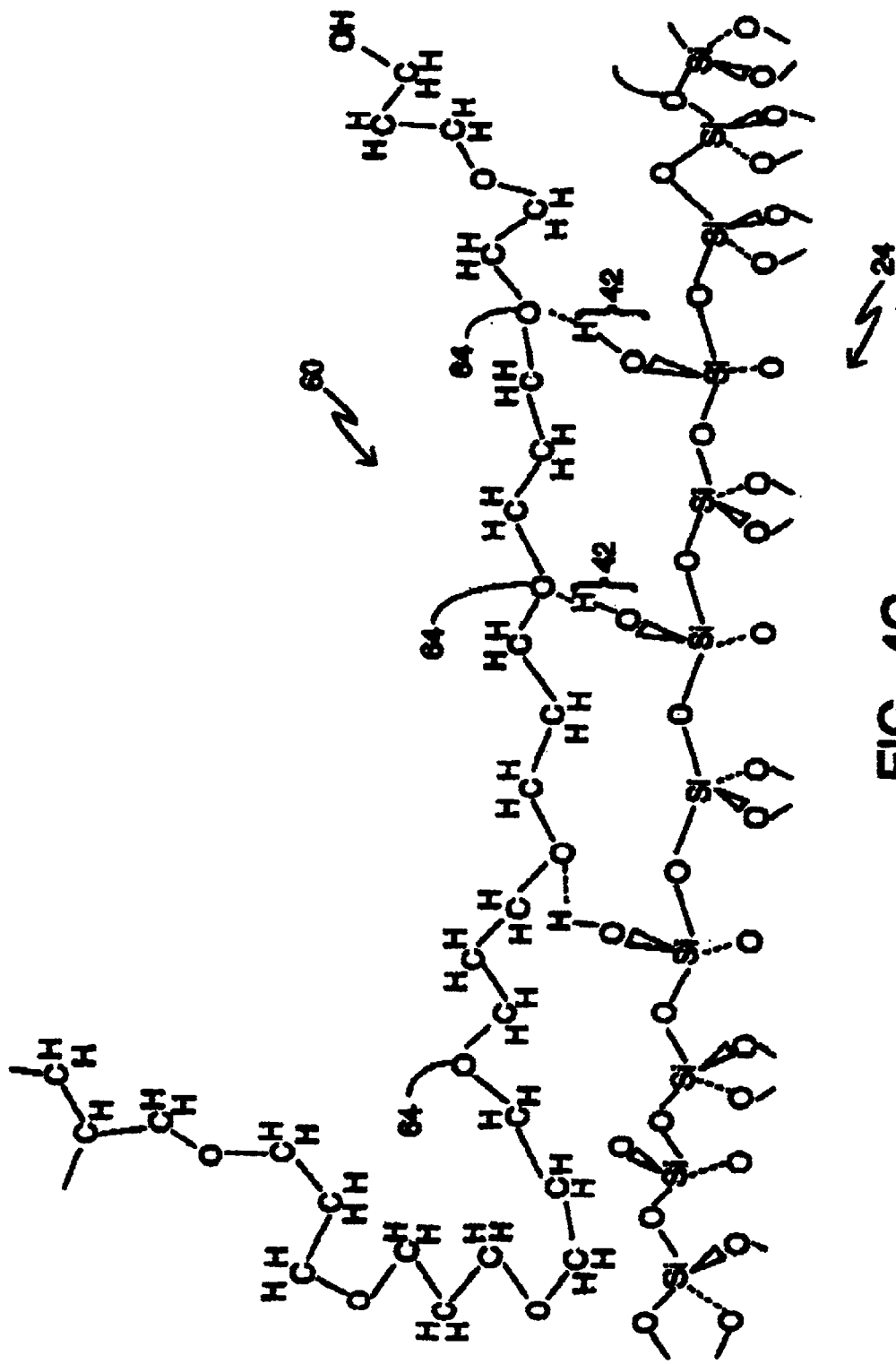
FIG. 4g is a drawing believed to show the bonding configuration between a GPO molecule and the silica surface.

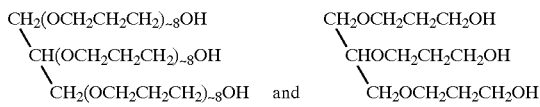

respectively. FIG. 4g illustrates what is believed to be the bonding configuration between the GPO molecule 60 and the silica surface 24. The GPO molecules hydrogen bond to silica through ether oxygens 64 to silanol sites 42 on silica surface 24. Glycerol propoxylate is structurally analogous to the aforementioned ethylene glycol ether compound, glycerol ethoxylate. The additional carbon atom iii each ether chain unit imparts a slightly greater hydrophobic character to the molecule than the ethylene glycol ethers.

Four different Ta barrier slurry formulations containing GPO-1500 and GPO-260 have been tested.

The tested slurry formulations are as follows:

| | |
|---|---|
| Slurry 7b: | Cabot SC113 |
| | 1,2,4-triazole (1.54 wt %) |
| | GPO-1500 (0.10 wt %) |
| | H$_2$O (4.35 wt %) |
| Slurry 7d: | Cabot SC113 |
| | 1,2,4-triazole (1.54 wt %) |
| | GPO-1500 (1.00 wt %) |
| | H$_2$O (4.31 wt %) |
| Slurry 7a: | Cabot SC113 |
| | 1,2,4-triazole (1.54 wt %) |
| | GPO-260 (0.10 wt %) |
| | H$_2$O (4.35 wt %) |
| Slurry 7c: | Cabot SC113 |
| | 1,2,4-triazole (1.54 wt %) |
| | GPO-260 (1.00 wt %) |
| | H$_2$O (4.31 wt %) |

The pH of each of these slurries is 8.9+/−0.1. All of the above compositions result in colloidal suspensions which are stable with respect to silica size distribution over greater than two months time.

Using a standardized Cu Damascene process, all of the above slurries have been evaluated for 1) their polishing rates of unpatterned Cu, Ta, and SiO$_2$ films, 2) the degree of Cu line dishing and Cu pattern erosion that results when used as a second step Ta polish, and 3) the tendency of the slurry to produce precipitate residues on Cu features. The results are summarized in Table 1. No silica precipitate or copper stain residues are discernable using visual and SEM inspection at any wafer locations for slurry 7d. The wafers polished with slurries 7a, 7b, and 7c exhibit a minor degree of silica precipitate and stain, although much less than present on the wafers using the control slurry. According to these results, it is believed that GPO will be effective as a precipitate/residue inhibitor for molecular weights of 260 or above, and for concentrations of 0.1 wt % or above.

Organic Amines

Another type of Ta barrier slurry additive shares three of the characteristics of the aforementioned hydrogen-bonding organic additives which are believed to inhibit residue and precipitate formation, namely:

1. The additive chemical species strongly adsorbs onto the surface of silica and/or copper hydroxide
2. The additive exhibits a high degree of surface coverage onto the reactive species, thereby occupying potential reaction sites
3. The additive adsorbant molecules are of a size to sterically hinder the collisions between two reactant molecules which result in new bond formation.

A category of chemical species which exhibits the above three characteristics comprises organic amines, which form strong electrostatic, rather than hydrogen, bonds to the surfaces of polymeric silica molecules and of copper (hydroxo) species. In basic solutions silica acquires a net negative charge, due to the neutralization of the weakly acidic silanol (Si—OH) groups present on the surface. In the mildly basic pH range (7<pH<10), many substituted organic amines and polymeric amines are positively charged in aqueous solution, due to protonation of the amine functional groups. These compounds are known to adsorb onto silica, forming strong electrostatic bonds.

Figure 4H:
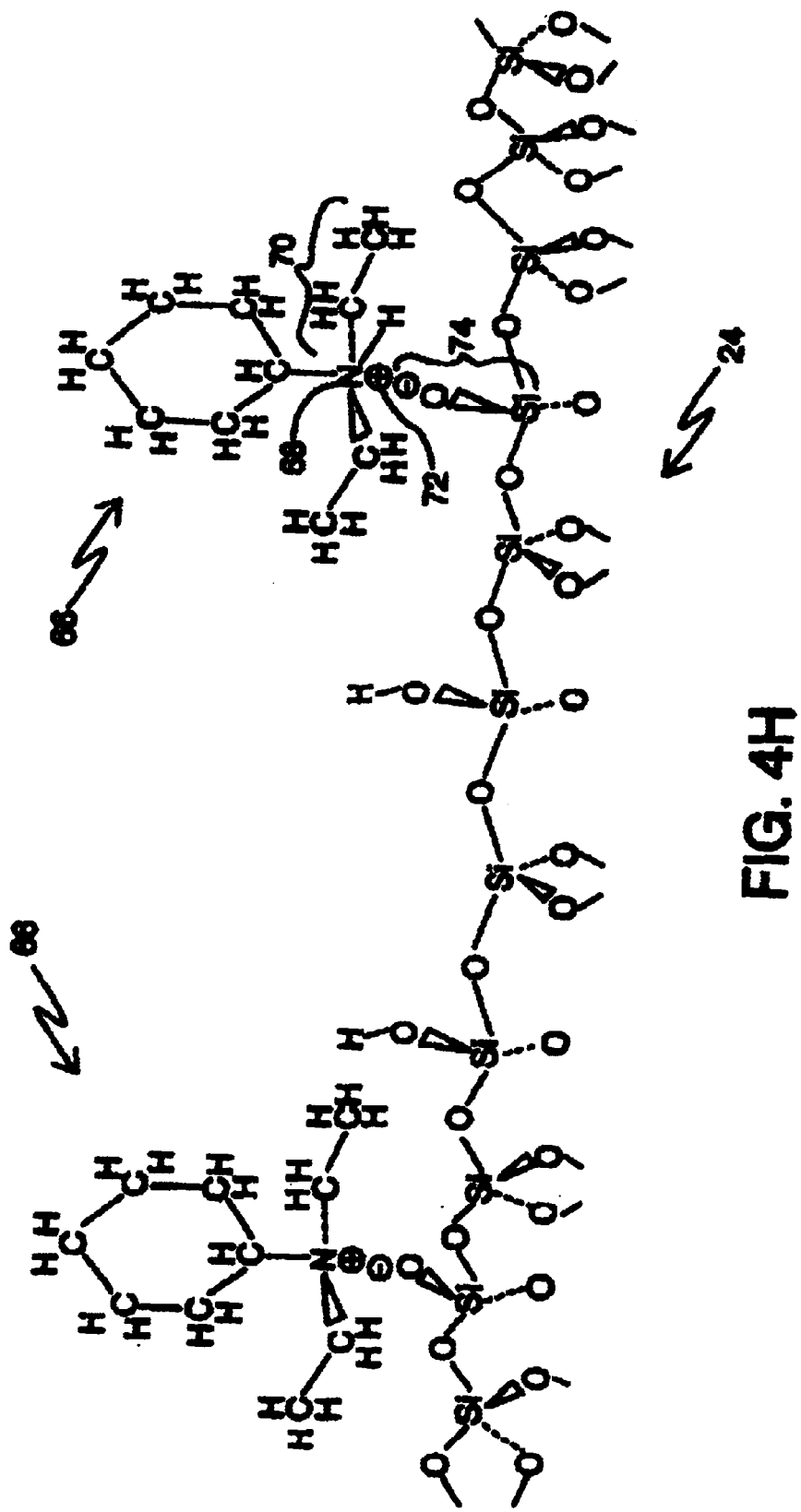
FIG. 4h is a drawing believed to show the bonding configuration between a DCA molecule and the silica surface.
Figure 41:
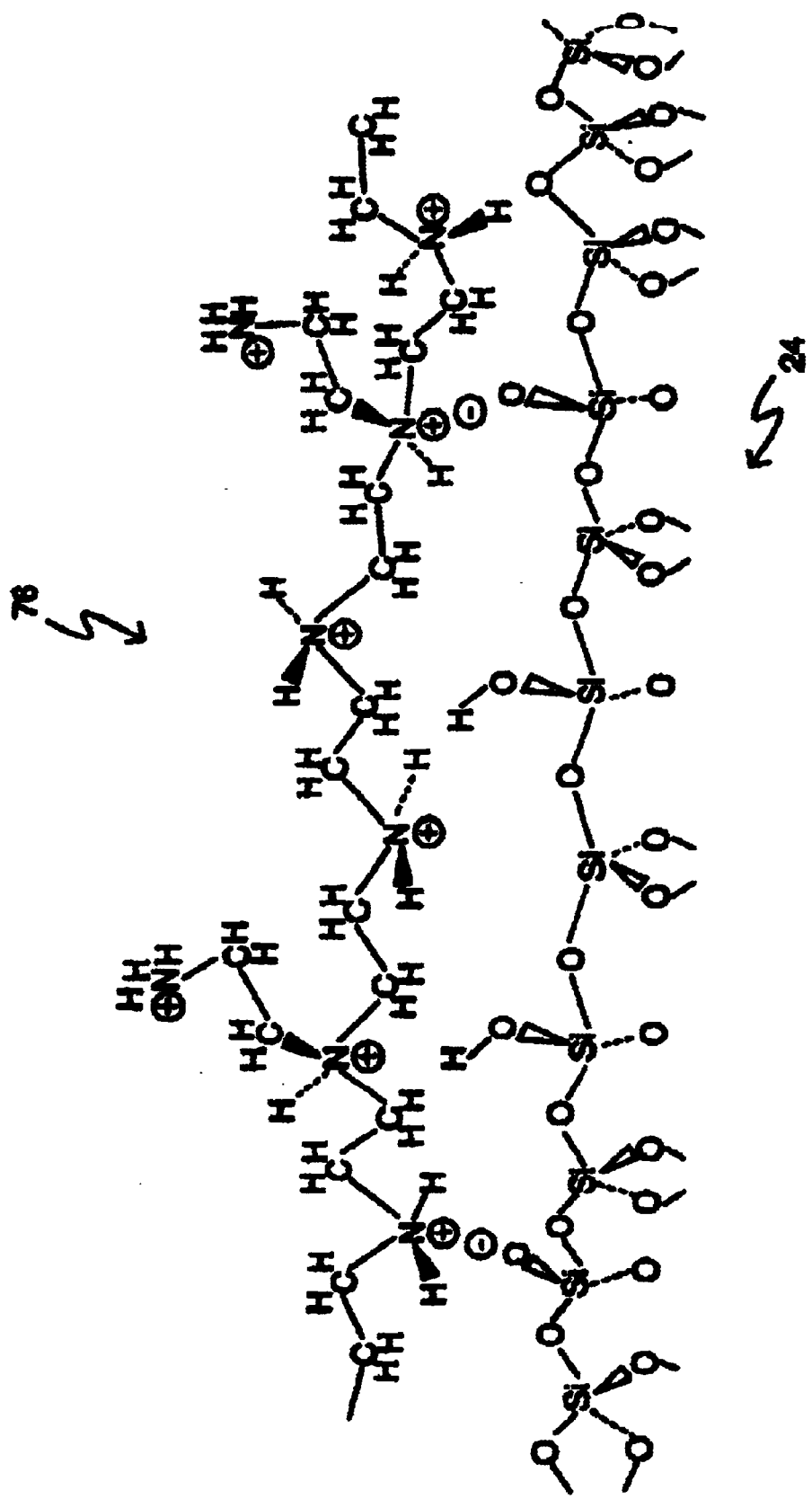

A first organic amine compound known as N,N-diethylcyclohexylamine has been tested as a Ta barrier slurry additive. The abbreviation for this compound is designated as DCA. Its chemical structure is $C_6H_{11}N(C_2H_5)_2$. FIG. 4h illustrates what is believed to be the bonding configuration between the DCA molecule 66 and the silica surface 24. Lone pair electrons of nitrogen atoms 68 in amine functional groups 70 are bonded to H$^+$ 72, thereby causing the DCA atom to become a positively charged ion. Negatively charged SiO— 74 on silica surface 24 provides an electrostatic bonding adsorption site for the DCA ion 66.

Two different Ta barrier slurry formulations containing DCA have been tested.

The tested slurry formulations are as follows:

| | |
|---|---|
| Slurry 5a: | Cabot SC113 |
| | 1,2,4-triazole (1.54 wt %) |
| | DCA (0.10 wt %) |
| | H$_2$O (4.35 wt %) |
| Slurry 5b: | Cabot SC113 |
| | 1,2,4-triazole (1.54 wt %) |
| | DCA (1.00 wt %) |
| | H$_2$O (4.30 wt %) |

The pH of each of these slurries is 8.9+/−0.1 The above compositions result in colloidal suspensions which are unstable with respect to silica size distribution over time. One day after preparation, both slurries exhibit moderate settling of large flocs on the bottom of the container.

A third Ta barrier slurry has been formulated using a related organic amine compound, polyethyleneimine, Mn 1800, a branched polymeric organic amine. The abbreviation for this compound is designated as PEI-1800. Its chemical structure is [—NHCH$_2$CH$_2$—]$_x$[—N(CH$_2$CH$_2$NH$_2$)CH$_2$CH$_2$—]$_y$. FIG. 4i illustrates what is believed to be the bonding configuration between the PEI-1800 molecule 76 and the silica surface 24.

The tested slurry formulation is as follows:

| | |
|---|---|
| Slurry 5c: | Cabot SC113 |
| | 1,2,4-triazole (1.54 wt %) |
| | PEI-1800 (0.013 wt %) |
| | H$_2$O (4.37 wt %) |

The pH of this slurry is app. 9. The above composition results in a colloidal suspension which is unstable with respect to silica size distribution over time. Seven days after preparation, the slurry exhibits a significant amount of settling of large flocs on the bottom of the container.

Using a standardized Cu Damascene process, all of the above slurries have been evaluated for 1) their polishing rates of unpatterned Cu, Ta, and $SiO_2$ films, 2) the degree of Cu line dishing and Cu pattern erosion that results when used as a second step Ta polish, and 3) the tendency of the slurry to produce precipitate residues on Cu features. The results are summarized in Table 1. The wafers polished with slurries 5a and 5c exhibit a moderate degree of silica precipitate and stain, although less than present on the wafers using the control slurry. The wafer polished with slurry 5b showed no improvement in the degree of precipitation when compared to the control.

According to these results, it is believed that, although the use of electrostatically bonding additives such as organic amines may act to inhibit silica precipitates, the electrostatic charge associated with such additives tends to destabilize the slurry and leads to settling.

Table 1 summarizes the results from all the aforementioned tested slurries. Included on the table are the slurry compositions, an indication of whether precipitate formation was seen, and an SEM microscope defect inspection summary. Polish rates of Cu, Ta, and oxide, as well as dishing, erosion, and Cu line protrusion, are not included in the table, since the values of each were acceptable for all the slurry formulations tested.

include 0.11 to 0.55 wt % high molecular weight PVA-18000, the 0.01–0.10 wt % DMSIO-EO, the 1.0 wt % GPO-1500, the 0.1–1.0 wt % high molecular weight PEG-10000, and the 1.0 wt % high molecular weight PAA-10000. Comparison of the low-molecular weight PAA and PEG with their corresponding high-molecular weight additives clearly indicates a correlation between higher molecular weight and better residue and precipitate suppression. There are at least two possible mechanisms for the improved suppression at higher molecular weights. One likely mechanism is that the larger adsorbed additive molecules sterically hinder the collisions between the reactant slurry molecules. Another likely mechanism involves the probable kinetics of the polymer adsorption/desorption process onto silica. Higher molecular weight adsorbants having a larger number of bonding sites would tend to be more likely to remain adsorbed even if some of the hydrogen bonds were broken. The larger molecules would likely thereby have a lower frequency of desorption/adsorption and as a result more effectively suppress the reactions between slurry molecules. Similar arguments are believed to explain the relatively poor residue and precipitate suppression using GEO1000, DEG and sorbital, all of which are lower in molecular weight than the additives which achieved the best results.

Comparison of lower concentrations of PAA-10000 and GPO-1500 with higher concentrations of these additives indicates a correlation between higher additive concentra-

TABLE 1

Summary of additive results

| SLURRY CODE | ADDITIVES | PRECIPITATE? | VISUAL (MICROSCOPE) INSPECTION SUMMARY |
|---|---|---|---|
| Control | None | Y | Heavy silica precipitate and stain residues across the wafer |
| D | 0.1% PAA-1500 | Y | Moderate ppt/stain, less than with control slurry |
| E | 1.0% PAA-1500 | Y | Moderate ppt/stain, less than with control slurry |
| F | 0.11% PVA-18000 | N | No silica precipitate or copper stain residues |
| G | 0.55% PVA-18000 | N | No silica precipitate or copper stain residues |
| 1a | 0.22% PVA-18000 0.05% NaDBS | N | No silica precipitate or copper stain residues |
| 1b | 0.55% PVA-18000 0.13% NaDBS | N | No silica precipitate or copper stain residues |
| 2a | 0.1% PEG-200 | Y | Minor ppt/stain, much less than with control slurry |
| 2b | 0.1% PEG-1000 | Y | Minor ppt/stain, much less than with control slurry |
| 2c | 1.0% PEG-200 | Y | Moderate ppt/stain, less than with control slurry |
| 2d | 1.0% PEG-1000 | Y | Minor ppt/stain, much less than with control slurry |
| 3a | 0.01% DMSiO-EO | Y | Very minor ppt, much less than with control slurry |
| 3b | 0.10% DMSiO-EO | N | No Silica precipitate or copper stain residues |
| 4b | 1.0% sorbitol | Y | Moderate ppt/stain, less than with control slurry |
| 5a | 0.1% DCA | Y | Moderate ppt/stain, less than with control slurry |
| 5b | 1.0% DCA | Y | No ppt/stain improvement over control slurry |
| 5c | 0.013% PEI | Y | Moderate ppt/stain, less than with control slurry |
| 6a | 0.1% DEG | Y | Moderate ppt/stain, less than with control slurry |
| 6b | 1.0% DEG | Y | Moderate ppt/stain, less than with control slurry |
| 6c | 0.1% GEO-1000 | Y | Little ppt/stain improvement over control slurry |
| 6d | 1.0% GEO-1000 | Y | Moderate ppt/stain, less than with control slurry |
| 7a | 0.1% GPO-260 | Y | Minor ppt/stain, much less than with control slurry |
| 7b | 0.1% GPO-1500 | Y | Minor ppt/stain, much less than with control slurry |
| 7c | 1.0% GPO-260 | Y | Minor ppt/stain, much less than with control slurry |
| 7d | 1.0% GPO-1500 | N | No silica precipitate or copper stain residues |
| 11a | 0.1% PEG-10000 | (N) | No ppt/stain except for one site on one wafer |
| 11b | 1.0% PEG-10000 | N | No silica precipitate or copper stain residue |
| 12a | 0.1% PAA-10000 | Y | Moderate ppt/stain, less than with control slurry |
| 12b | 1.0% PAA-10000 | (N) | No silica precipitate or copper stain residue except for one site with very minimal ppt/stain |

It is seen that excellent precipitate/residue characteristics are achieved using slurries F, G, 1a, 1b, 3b, 7d, and 11b. Good results are achieved with slurries 3a, 11a and 12b. These best results correspond to all the slurries which include tion and better residue and precipitate suppression. This is believed to be due to the need for high surface coverage of the reactive molecules by the additive adsorbants. This explanation is supported by the observation that the surfactant additive DMSiO-EO is effective at lower concentrations than the equivalent non-surfactant additives.

B. ALTERNATIVE POLISHING PROCESS EMBODIMENTS

A first embodiment of the invention as described above utilizes the additive-containing slurry throughout the entire polish process. Several alternative embodiments of tie invention employ the additive-containing slurry or portions thereof with differing methods and at differing times at the end of the polish process only. Among the advantages of the alternative embodiments are: 1) the maintenance of maximum Ta and oxide removal rates, 2) maintenance of selectivities, and 3) minimizing clogging of filters. Advantages of the first embodiment include: 1) manufacturing simplicity, and 2) since oxide and Ta removal rates vary according to the concentration of the organic additive, utilizing the additive during the whole polishing process provides the ability to tailor selectivity of Ta to oxide removal rate, e.g., suppressing oxide removal rate more than Ta rate, thereby decreasing erosion.

The chemical additive which has been used to test the alternative embodiments is PEG-10,000. The Cu passivation agent used to test the alternative embodiments is 1,2,4-triazole. It is anticipated that all of the organic additives which produced no precipitates or stains in the first embodiment will have similar effect as the PEG, and that other Cu passivation agents such as: benzotriazole (BTA), imidazole, 5-methyl benzimidazole, polyaniline, indazole, and purine, can be combined with any of the aforementioned organic additives to produce the similar effect.

1. 1,2,4 triazole and PEG Use During Wafer De-chuck Operation

The wafer de-chuck operation to facilitate removal of the wafer from the polishing pad is done after the polishing step is substantially complete. On the Mirra polisher from Applied Materials, which was used to obtain the data shown here, the wafer de-chuck operation is a 5–10 second operation in which vacuum is used to create suction cups in the membrane portion of the carrier which contacts the wafer. These suction cups are utilized to pick up the wafer from the polishing pad. During the de-chuck operation, there is no applied downward pressure on the wafer, but rotation continues. The weight of the carrier on the wafer results in a downward force on the wafer of approximately 0.5 psi, compared with 2–4 psi during polishing. Prior art methods comprise cessation of slurry flow, with DI water being dispensed onto the polish platen during the de-chuck operation.

In a second embodiment of our invention, Ta CMP is completed using a slurry equivalent to the above-mentioned control slurry, comprising triazole, H2O, and a silica abrasive such as Cabot SCE or SC113 or Silica Emulsion ER80500 by Arch Chemical, Phoenix, Ariz. During the de-chuck operation, following decrease or cessation of slurry flow, a mixture of 3.0% 1,2,4-triazole and 0.5% PEG in DI water is dispensed onto the polish platen instead of just DI water. Results using this procedure show no visible Cu-silica precipitate formation or copper staining, in contrast to wafers polished using prior art de-chuck operation with DI water alone. This method can be utilized with other polisher apparatus by dispensing the triazole-PEG solution onto the polish pad curing the wafer pick-up after Ta CMP. It is anticipated that all of the organic additives which produced no precipitates or stains in the first embodiment will have similar effect as the PEG in this second embodiment.

2. POU Mixing of Organic Additives into Slurry at the End of the Polish Cycle

A third embodiment of our invention utilizes Point-of-Use (POU) mixing of PEG-10,000 or any other of the aforementioned organic additives with the control slurry, at the end of the polish cycle only. POU is a method of mixing slurry components whereby components are dispensed from separate containers and mixed together in real time close to dispense onto the platen. In this embodiment of the invention, for 90% of the polish time the aforementioned control Ta slurry or its equivalent is used without the addition of the organic additive, followed by POU mixing the 0.5% PEG additive (or other additive as described above) with the control slurry for the last 10% of the polish time. Results using this procedure show no visible Cu-silica precipitate formation or copper staining.

3. Organic Additive Used in Post Ta CMP Buff Step

A fourth embodiment of our invention utilizes a solution of PEG-10,000 (or other organic additive as described above) and 1,2,4 triazole (or other copper passivation agent) in DI water for a post Ta CMP buff step. Prior art has utilized a 20 second post-CMP buff step using a soft pad (polytex supreme, by way of example) while applying a small amount (i.e., 1–2.5 psi) of pressure following tungsten CMP. This prior art buff method, when applied after copper CMP using prior art slurries not containing organic additives, results in the precipitate and copper staining as described above. In tests of this fourth embodiment of our invention, decreasing or ceasing the slurry and introducing a mixture of 0.1–2.0% PEG-10,000 and 2–3% 1,2,4-triazole in DI water for 5–30 seconds with 0.5–2.0 psi pressure during post Ta CMP buff has prevented the formation of precipitate and copper staining on the Cu surface. This approach has been shown to have no substantial effect on polish rates and selectivities, and maintains the oxide polish rate for a high planarization efficiency. Furthermore, using this method, an improvement of 30–40% in copper and oxide surface roughness, measured by Atomic Force Microscopy (AFM), has been achieved over prior methods.

The addition to Ta CMP slurries of certain organic chemical substances which form multiple hydrogen bonds with the surfaces of polymeric silica molecules and/or of copper (hydroxo) species has been shown to greatly suppress the formation of silica precipitates and copper stains. Use of the organic chemical substances in a polishing additive solution used during the end portion of the polish cycle has shown similar effects. The elimination or substantial reduction of these defects in the copper metallization lines will result in improved reliability.

It is not intended that our invention be restricted to the exact embodiments described herein. Use of other chemical substances than those listed, but which share the properties of multiple hydrogen bonds with the surfaces of polymeric silica molecules and/or of copper(hydroxo) species may be used without altering the inventive concept. These additives may also be used in Ta barrier slurries for copper CMP which use other abrasives such as alumina in place of silica, since the presence of dissolved $SiO_2$ CMP byproducts in the slurry medium can also result in precipitates and copper staining. The scope of the invention should be construed in view of the claims.

We claim:

1. A Chemical-Mechanical Polishing (CMP) method for polishing Ta barrier layers in integrated circuit metallization structures including copper and silica, said method including flowing polishing slurry containing silica abrasive, DI water, and a copper passivation agent, onto a platen, inducing relative motion between said wafer and said platen and maintaining a force between said platen and said wafer, and removing said wafer from against said platen, said polishing occurring for a total polishing period of time, comprising, incorporating into said polishing slurry for a final portion of said total polishing period of time less than or equal to 10% of said total polishing period of time, an organic additive selected from the group consisting of:

polyvinyl alcohol (PVA), PVA-poly(vinyl acetate) co-polymer, PVA-polyethylene co-polymer, sorbitol, glycerol, polyacrylamide (PAA), ethylene glycol, di(ethylene glycol), poly(ethylene glycol) (PEG), glycerol ethoxylate (GEO), dimethylsiloxane-ethylene oxide co-polymer (DMSiO-EO), polyethylene oxide surfactants, octylphenol polyethylene oxide, nonylphenol polyethylene oxide, polyoxyethylene lauryl ether, polyoxyethylene cetyl ether, perfluorinated analogs of polyethylene oxide surfactants, glycerol propoxylate (GPO), organic amines, N,N-diethylcyclohexylamine (DCA), and polyethyleneimine (PEI);

said organic additive not being included in said polishing slurry prior to said final portion of said total polishing period of time.

2. The method of claim 1, wherein said polishing slurry containing said organic additive is formed by Point-of-Use (POU) mixing of said organic additive with said polishing slurry containing said DI water, said silica abrasive, and said Cu passivation agent.

3. The CMP method of claim 2, wherein said organic additive comprises PEG-10000 and said Cu passivation agent comprises 1,2,4-triazole.

4. The CMP method of claim 3, wherein said polishing slurry containing said organic additive comprises:

1.54 wt % 1,2,4-triazole;

0.5 wt % PEG-10,000;

93.6 wt % silica suspension containing 13.6 wt % SiO2;

4.33 wt % DI water.

5. In a Chemical-Mechanical Polishing (CMP) method for polishing Ta barrier layers in integrated circuit metallization structures including copper and silica, said method including flowing polishing slurry containing silica abrasive, DI water, and a copper passivation agent onto a platen, inducing relative motion between said wafer and said platen while maintaining a force between said platen and said wafer, and removing said wafer from against said platen, said polishing occurring for a first polishing period of time, the improvement comprising:

decreasing said flow of said polishing slurry prior to said step of removing said wafer from against said platen; and following said step of decreasing said flow of said polishing slurry and prior to said step of removing said wafer from against said platen, flowing a polishing additive solution onto said platen for a second period of time while inducing relative motion between said wafer and said platen and maintaining a force between said platen and said wafer;

said polishing additive solution comprising;

DI water;

a copper passivation agent selected from the group consisting of, 1,2,4-triazole, benzotriazole (BTA), imidazole, 5-methyl benzimidazole, polyaniline, indazole, and purine; and an organic additive selected from the group consisting of, polyvinyl alcohol (PVA), PVA-poly(vinyl acetate) co-polymer, PVA-polyethylene co-polymer, sorbitol, glycerol, polyacrylamide (PAA), ethylene glycol, di(ethylene glycol), poly(ethylene glycol) (PEG), glycerol ethoxylate (GEO), dimethylsiloxane-ethylene oxide co-polymer (DMSiO-EO), polyethylene oxide surfactants, octylphenol polyethylene oxide, nonylphenol polyethylene oxide, polyoxyethylene lauryl ether, polyoxyethylene cetyl ether, perfluorinated analogs of polyethylene oxide surfactants, glycerol propoxylate (GPO), organic amines, N,N-diethylcyclohexylamine (DCA), and polyethyleneimine (PEI);

said polishing slurry not including said organic additive prior to said step of flowing said polishing additive solution.

6. The method of claim 5 wherein the step of decreasing said flow of said slurry decreases said flow to zero.

7. The CMP method of claim 5, wherein said organic additive comprises PEG-10,000 and said copper passivation agent comprises 1,2,4-triazole.

8. The CMP method of claim 5, wherein said steps of decreasing said flow of said polishing slurry and flowing of said polishing additive solution are performed just prior to wafer de-chuck operation.

9. The CMP method of claim 8, wherein the step of decreasing said flow of said slurry decreases said flow to zero.

10. The CMP method of claim 9, wherein said organic additive comprises PEG-10,000 and said copper passivation agent comprises 1,2,4-triazole.

11. The CMP method of claim 10, wherein said polishing additive solution comprises:

3.0 wt % 1,2,4-triazole;

0.5 wt % PEG-10,000, and

DI water.

12. The CMP method of claim 5, wherein said steps of decreasing said flow of said polishing slurry and flowing of said polishing additive solution are performed just prior to post-Ta CMP buff operation.

13. The CMP method of claim 12, wherein the step of decreasing said flow of said slurry decreases said flow to zero.

14. The CMP method of claim 13, wherein said organic additive comprises PEG-10,000 and said copper passivation agent comprises 1,2,4-triazole.

15. The CMP method of claim 14, wherein said polishing additive solution comprises:

2.0–3.0 wt % 1,2,4-triazole;

0.1–2.0 wt % PEG-10,000, and

DI water;

and wherein said post-CMP buff step utilizes 0.5–2.0 psi down force for 5–30 seconds.

* * * * *